United States Patent
Nagai et al.

(10) Patent No.: US 12,237,556 B2
(45) Date of Patent: Feb. 25, 2025

(54) ELECTRONIC DEVICE

(71) Applicant: Murata Manufacturing Co., Ltd., Nagaokakyo (JP)

(72) Inventors: Tomohiro Nagai, Nagaokakyo (JP); Nobuo Ikemoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 232 days.

(21) Appl. No.: 17/983,445

(22) Filed: Nov. 9, 2022

(65) Prior Publication Data
US 2023/0068119 A1    Mar. 2, 2023

Related U.S. Application Data

(63) Continuation of application No. PCT/JP2021/020808, filed on Jun. 1, 2021.

(30) Foreign Application Priority Data

Jun. 8, 2020  (JP) .................. 2020-099059

(51) Int. Cl.
*H01P 3/08* (2006.01)
*H05K 1/02* (2006.01)
(Continued)

(52) U.S. Cl.
CPC ............... *H01P 3/08* (2013.01); *H01P 3/088* (2013.01); *H05K 1/0237* (2013.01); *H05K 1/05* (2013.01); *H05K 1/115* (2013.01); *H05K 1/147* (2013.01)

(58) Field of Classification Search
CPC ... H01P 3/08; H01P 3/088; H01P 3/10; H05K 1/0237
(Continued)

(56) References Cited

U.S. PATENT DOCUMENTS

| | | | |
|---|---|---|---|
| 5,510,758 A | 4/1996 | Fujita et al. | |
| 2016/0268666 A1* | 9/2016 | Wakabayashi | .......... H01P 3/082 |

(Continued)

FOREIGN PATENT DOCUMENTS

| | | |
|---|---|---|
| JP | S5413981 A | 2/1979 |
| JP | H0746009 A | 2/1995 |

(Continued)

OTHER PUBLICATIONS

International Search Report in PCT/JP2021/020808, mailed Aug. 24, 2021, 3 pages.

(Continued)

*Primary Examiner* — Rakesh B Patel
(74) *Attorney, Agent, or Firm* — Keating & Bennett, LLP

(57) ABSTRACT

An electronic device includes a first substrate and a second substrate. On or in the first substrate, a signal conductor extending in a transmission direction of a high-frequency signal and including a turn portion when viewed in plan is provided. On or in the second substrate, a base overlapping the signal conductor in plan view and including a turn portion while extending along the signal conductor is provided. The base is defined by, for example, a metal plate, has electrical conductivity, and serves as a ground conductor. A gap is provided between the signal conductor and the base having electrical conductivity.

20 Claims, 15 Drawing Sheets

(51) Int. Cl.
  *H05K 1/05* (2006.01)
  *H05K 1/11* (2006.01)
  *H05K 1/14* (2006.01)

(58) Field of Classification Search
  USPC .................................. 333/204–205, 236–238
  See application file for complete search history.

(56) References Cited

U.S. PATENT DOCUMENTS

2017/0033426 A1  2/2017  Baba et al.
2017/0125870 A1* 5/2017  Baba ..................... H05K 1/111
2017/0367181 A1  12/2017 Baba

FOREIGN PATENT DOCUMENTS

JP   2004201135 A   7/2004
JP   2011160231 A   8/2011
JP   2011182311 A   9/2011
WO   2016088693 A1  6/2016
WO   2017098921 A1  6/2017

OTHER PUBLICATIONS

Written Opinion in PCT/JP2021/020808, mailed Aug. 24, 2021, 5 pages.

* cited by examiner

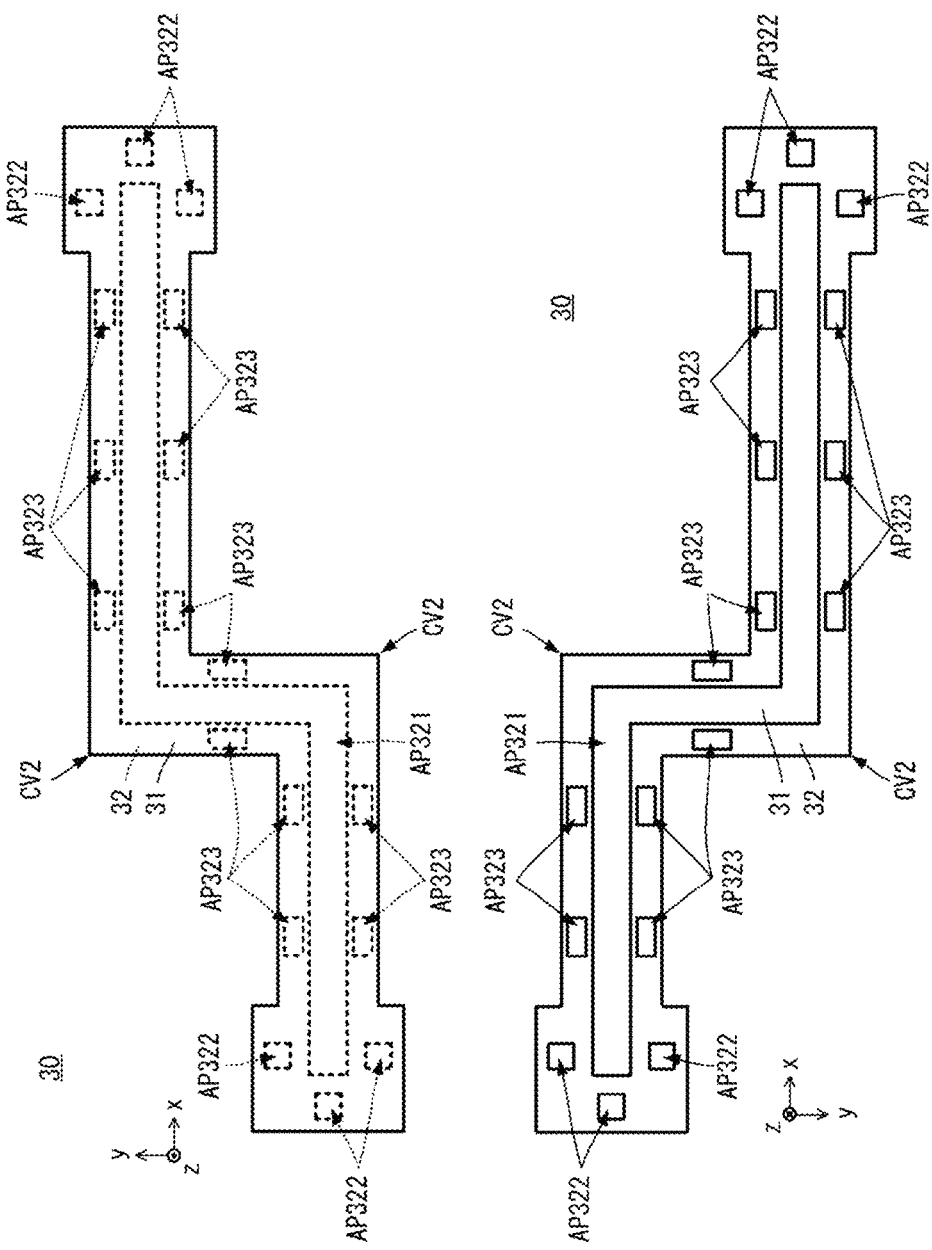

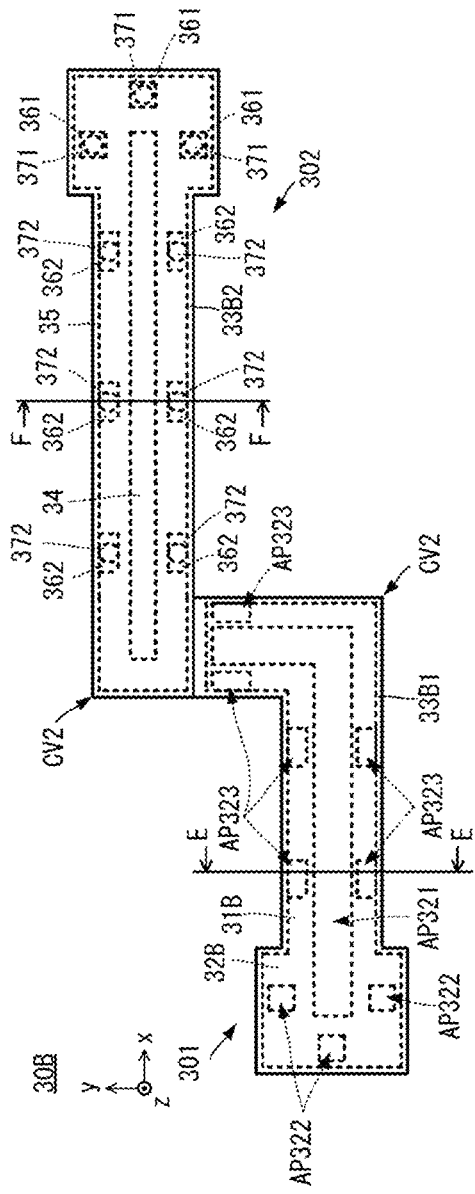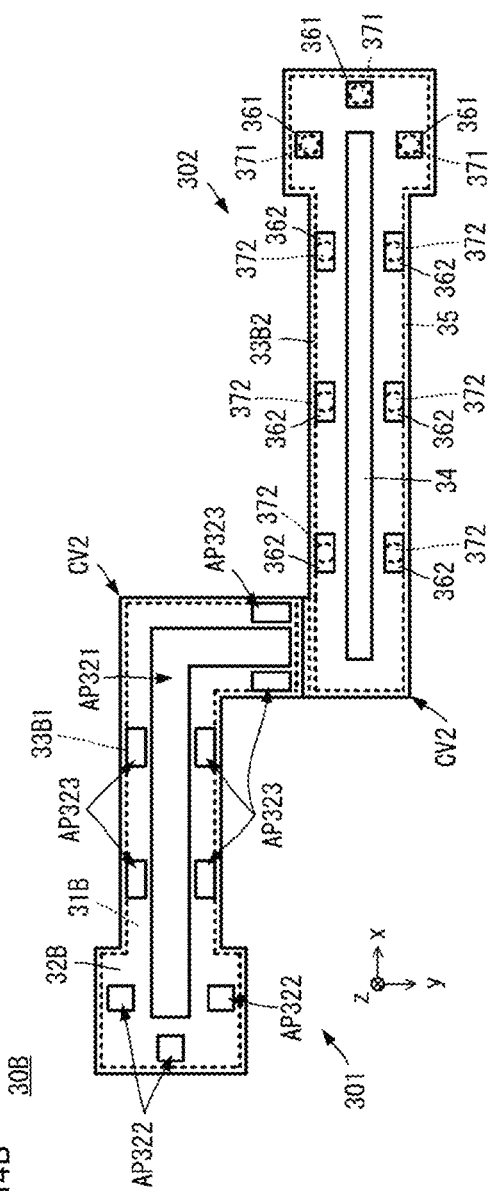

ELECTRONIC DEVICE

CROSS REFERENCE TO RELATED APPLICATIONS

This application claims the benefit of priority to Japanese Patent Application No. 2020-099059, filed on Jun. 8, 2020, and is a Continuation Application of PCT Application No. PCT/JP2021/020808, filed on Jun. 1, 2021. The entire contents of each application are hereby incorporated herein by reference.

BACKGROUND OF THE INVENTION

1. Field of the Invention

The present disclosure relates to an electronic device including a signal conductor that transmits a high-frequency signal.

2. Description of the Related Art

International Publication No. 2016/0088693 discloses an electronic device including a first substrate and a second substrate. Regarding the electronic device described in International Publication No. 2016/0088693, the second substrate is mounted on a surface of the first substrate.

The second substrate has a high-frequency transmission line. More specifically, the second substrate has a signal conductor and plural ground conductors. The plural ground conductors are arranged above and below the second substrate in the thickness direction. That is, in the second substrate, the plural grounds and the signal conductor are arranged, at spaces, in the thickness direction. The second substrate is made of a low dielectric constant material. Thus, the loss of the high-frequency transmission line can be reduced, and the height of the second substrate can be reduced.

However, regarding the configuration described in International Publication No. 2016/0088693, there is a limit to a reduction in the height of the second substrate because the high-frequency transmission line is required to maintain desired characteristics. Thus, there is a limit to height reduction even with the electronic device in which the second substrate is mounted on the surface of the first substrate.

SUMMARY OF THE INVENTION

Accordingly, preferred embodiments of the present invention provide electronic devices with each of which losses in a high-frequency transmission line can be reduced while also reducing a height of the high-frequency transmission line.

A preferred embodiment of the present invention provides an electronic device which includes a first substrate and a second substrate. On or in the first substrate, a first signal conductor extending in a transmission direction of a high-frequency signal is provided. On or in the second substrate, a first ground conductor is provided. A gap is provided between the first signal conductor and the first ground conductor. The first signal conductor includes a turn portion when viewed in plan. The first ground conductor overlaps the first signal conductor in a plan view and includes a turn portion while extending along the first signal conductor.

In this configuration, a pair of the first signal conductor and the first ground conductor define a transmission line. The second substrate includes the first ground conductor but does not include a first signal conductor, thereby being thin. Thus, a low-height transmission line is provided. In addition, the capacitance between the first ground conductor and the first signal conductor can be reduced due to the gap between the first ground conductor and the first signal conductor. Thus, further height reduction and a desired impedance both are achieved.

According to preferred embodiments of the present invention, the loss of the high-frequency transmission line can be suppressed from increasing, and the height of the configuration can be reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6A is a first plan view of a second substrate 30 according to a preferred embodiment of the present invention, and FIG. 6B is a second plan view of the second substrate 30 according to a preferred embodiment of the present invention.

FIGS. 14A and 14B include plan views of a second substrate 30B of the electronic device 10B according to the third preferred embodiment of the present invention.

DETAILED DESCRIPTION OF THE PREFERRED EMBODIMENTS

First Preferred Embodiment

Figure 1:
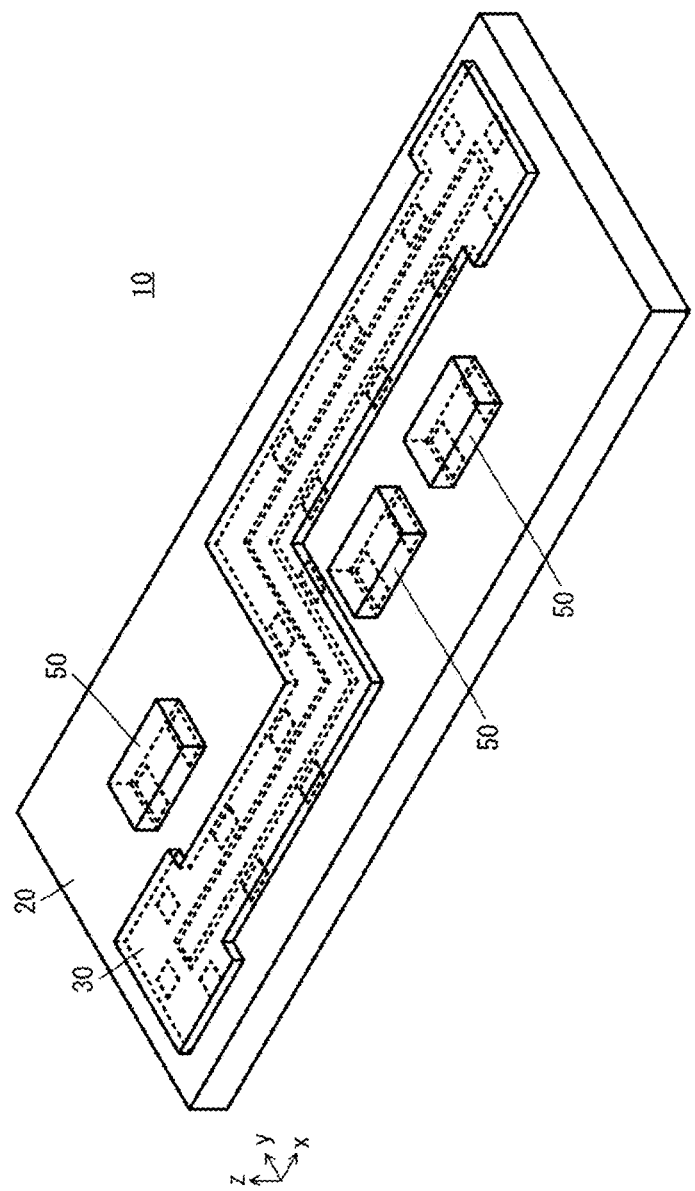
FIG. 1 is a perspective view of an electronic device 10 according to a first preferred embodiment of the present invention.
Figure 2:
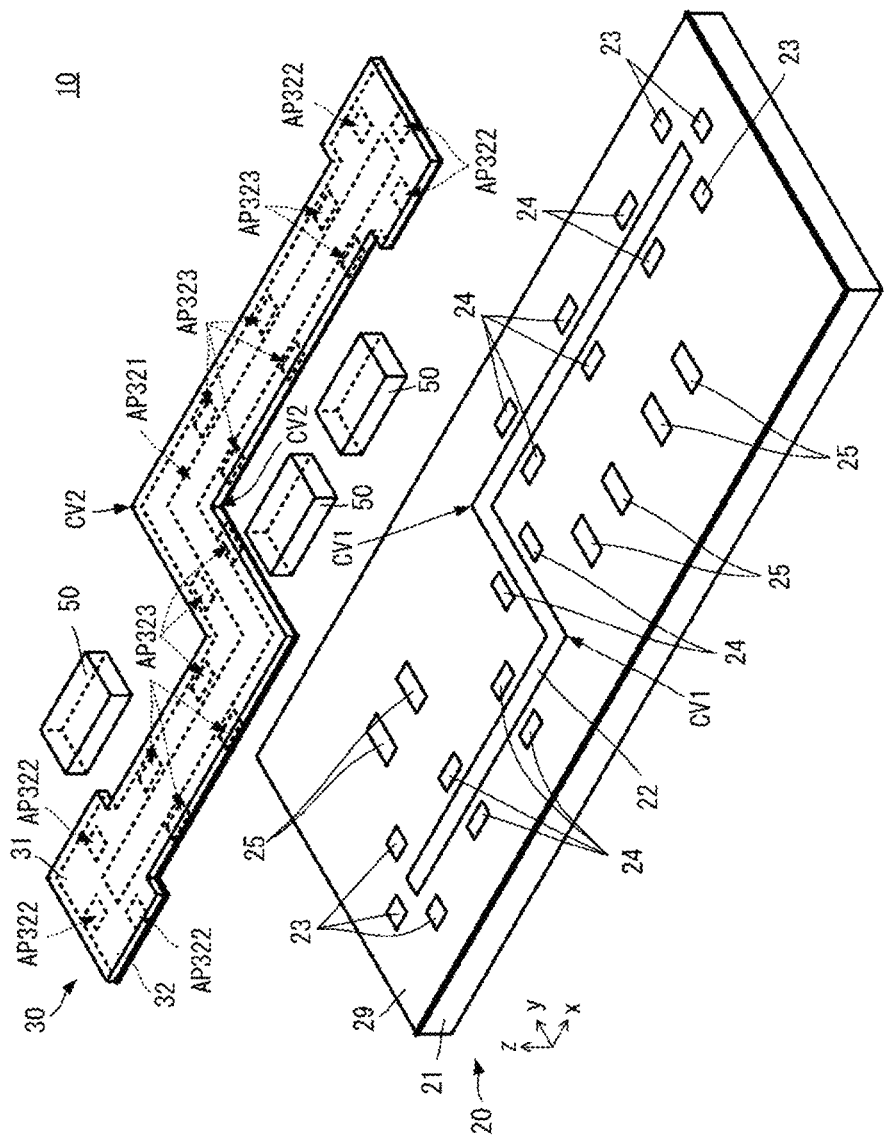
FIG. 2 is an exploded perspective view of the electronic device 10 according to the first preferred embodiment of the present invention.
Figure 3:
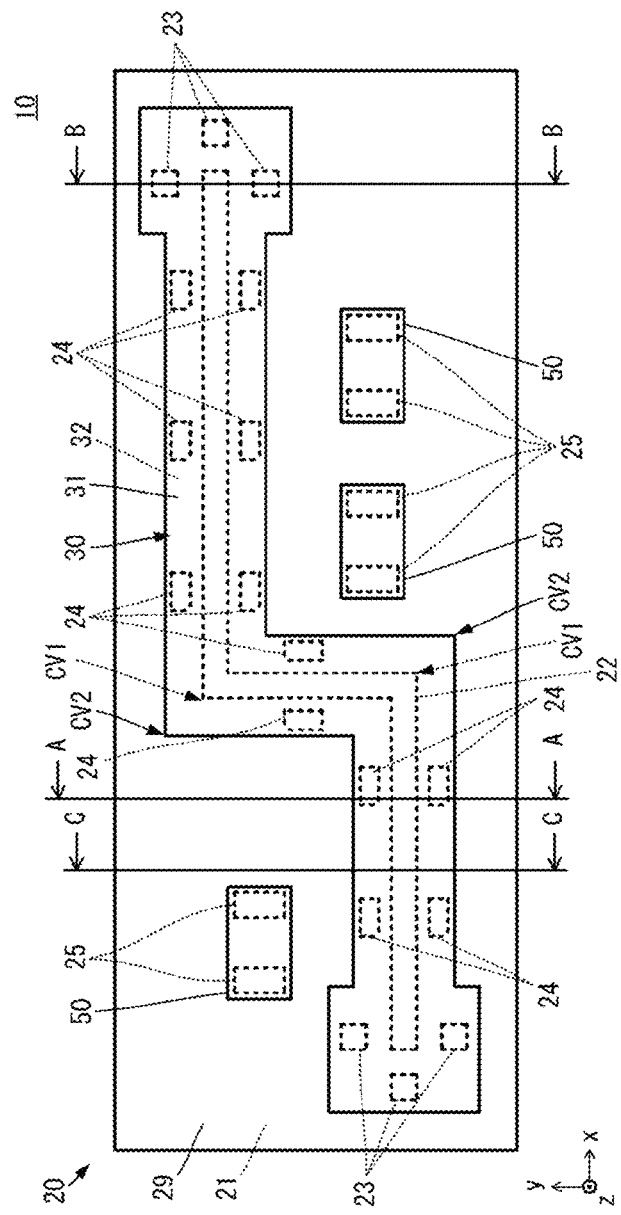
FIG. 3 is a plan view of the electronic device 10 according to the first preferred embodiment of the present invention.
Figure 4A:
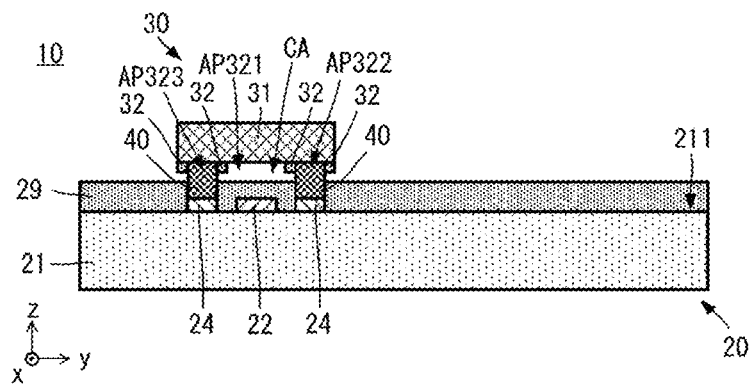
FIGS. 4A to 4C are sectional views of the electronic device 10 according to the first preferred embodiment of the present invention.
Figure 4B:
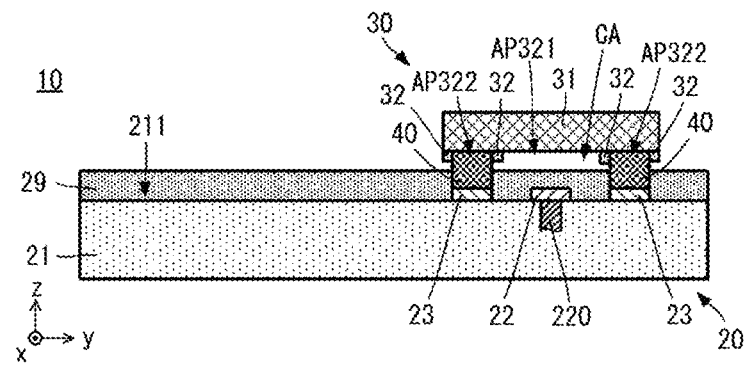
Figure 4C:
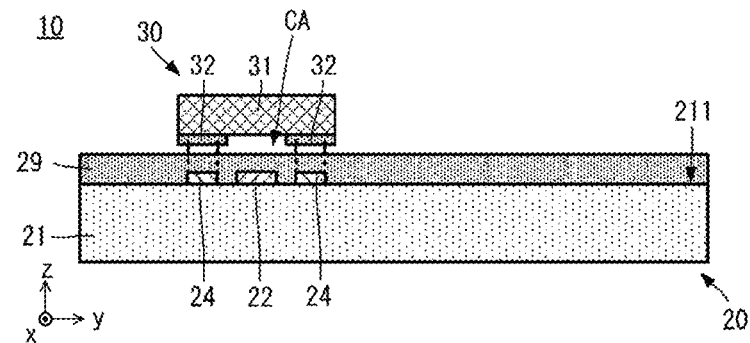
Figure 5:
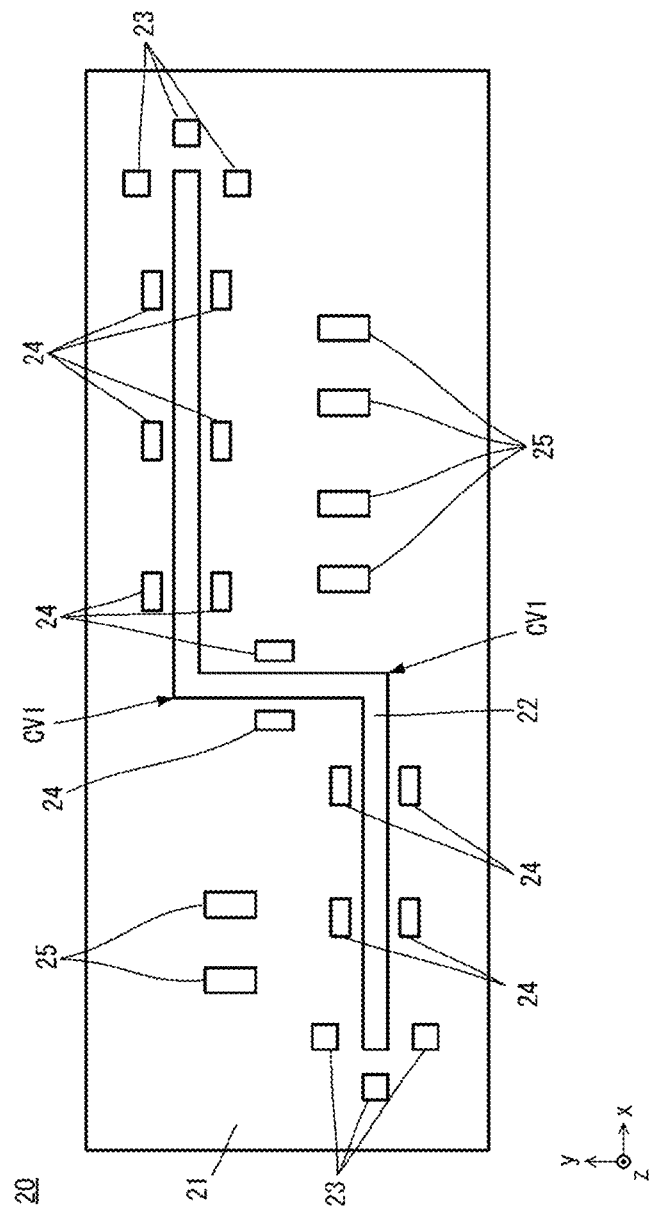
FIG. 5 is a plan view of a first substrate 20 according to a preferred embodiment of the present invention.

An electronic device according to a first preferred embodiment of the present invention will be described with reference to the drawings. FIG. 1 is a perspective view of the electronic device according to the first preferred embodiment. FIG. 2 is an exploded perspective view of an electronic device 10 according to the first preferred embodiment. FIG. 3 is a plan view of the electronic device 10 according to the first preferred embodiment. FIGS. 4A to 4C are sectional views of the electronic device 10 according to the first preferred embodiment. FIG. 5 is a plan view of a first substrate 20. In the drawings, for example, dimensions are exaggerated appropriately to help facilitate understanding of the characteristics of the present disclosure.

As FIG. 1, FIG. 2, FIG. 3, FIGS. 4A to 4C illustrate, the electronic device 10 includes the first substrate 20, the second substrate 30, and plural components 50. The number of the components 50 is, for example, three in the present preferred embodiment but is not limited to three.

Configuration of First Substrate 20

The first substrate 20 includes a base 21, a signal conductor 22, plural ground land conductors 23, plural ground land conductors 24, plural component land conductors 25, and an insulating protection film 29.

The base 21 is provided by, for example, a solid insulating resin substrate. Note that various types of conductor patterns defining the electronic device 10 are inside the base 21 but are neither described nor illustrated in detail. The base 21 has a flat plate shape and includes a main surface 211.

The signal conductor 22 is provided on the main surface 211 of the base 21. The signal conductor 22 is defined by, for example, a thin conductor film such as copper foil. The signal conductor 22 has a shape extending in a transmission direction of a high-frequency signal. The signal conductor 22 includes a turn portion CV1 at a position in the middle in the extending direction of the signal conductor 22. The turn portion CV1 is a portion at which the extending direction of the signal conductor 22 is changed. For example, in the example of FIG. 1, FIG. 2, and FIG. 3, the signal conductor 22 extends from one end thereof in the x-axis direction, is bent at the turn portion CV1, extends in the y-axis direction, is bent at another turn portion CV1, and extends again in the x-axis direction to the other end of the signal conductor 22. Both ends of the signal conductor 22 are connected to another conductor pattern by, for example, an interlayer connection conductor formed inside the base 21 (not illustrated). The signal conductor 22 corresponds to a "first signal conductor".

The turn portion CV1 of the signal conductor 22 is defined by a conductor pattern being processed to have the turn portion CV1, not by the signal conductor 22 being bent at the turn portion CV1. More specifically, for example, the signal conductor 22 is preferably formed through the following manufacturing process. First, a substrate including a conductor (electrode) on one side is prepared. Next, a conductor pattern having the turn portion CV1 is formed by, for example, pattern etching. Through the process, the signal conductor 22 having the turn portion CV1 is formed.

Each of the plural ground land conductors 23 preferably has a rectangular or substantially rectangular shape in plan view. The plural ground land conductors 23 are provided around one end and the other end of the signal conductor 22. Each of the plural ground land conductors 23 is connected to a ground conductor of the base 21 with, for example, an interlayer connection conductor that is provided inside the base 21 interposed therebetween (not illustrated).

Each of the plural ground land conductors 24 has a rectangular or substantially rectangular shape in plan view. The plural ground land conductors 24 are provided, at spaces, in the extending direction of the signal conductor 22. The plural ground land conductors 24 are provided beside the signal conductor 22, on both sides in a width direction orthogonal or substantially orthogonal to the extending direction of the signal conductor 22. Each of the plural ground land conductors 24 is connected to the ground conductor of the base 21 with, for example, an interlayer connection conductor that is provided inside the base 21 interposed therebetween (not illustrated).

Each of the plural component land conductors 25 has a rectangular or substantially rectangular shape in plan view. The plural component land conductors 25 are arranged according to the mounting positions of the components 50. The positions of the plural component land conductors 25 are spaced away from the positions of the signal conductor 22, the plural ground land conductors 23, and the plural ground land conductors 24.

Conversely, the signal conductor 22, the plural ground land conductors 23, and the plural ground land conductors 24 are spaced away from the positions of the plural component land conductors 25. That is, the signal conductor 22 is preferably arranged to avoid the positions of the plural component land conductors 25, namely, the mounting positions of the components 50. At this point, by including the turn portion CV1, the signal conductor 22 can be arranged appropriately according to the arrangement positions of the plural component land conductors 25.

The insulating protection film 29 is provided on the main surface 211 of the base 21. The insulating protection film 29 includes an opening through which each of the plural ground land conductors 23, the plural ground land conductors 24, and the plural component land conductors 25 is exposed outside. The insulating protection film 29 may include an opening through which the signal conductor 22 is exposed outside.

Configuration of Second Substrate 30

FIG. 6A is a first plan view of the second substrate, and FIG. 6B is a second plan view of the second substrate.

The second substrate 30 includes a base 31 and an insulating protection film 32. The base 31 is, for example, a metal plate. The base 31 is thicker than the signal conductor 22. More specifically, with the thickness, the base 31 is rigid enough to maintain the shape only by itself.

The base 31 has a shape extending in the transmission direction of a high-frequency signal. In other words, in plan view, the base 31 has a shape the same as or similar to the shape of the signal conductor 22. Thus, the base 31, that is, the second substrate 30 includes a turn portion CV2 at a position in the middle in the extending direction of the base 31. The turn portion CV2 is a portion at which the extending direction of the base 31 is changed.

The turn portion CV2 of the base 31 is provided by the base 31 with the turn portion CV2 being cut out, not by the base 31 being bent at the turn portion CV2. More specifically, for example, the base 31 is preferably formed through the following manufacturing process. First, patterns to be plural bases 31 are formed on a collective board (a substrate having a size large enough to form the plural bases 31). Next, each of the patterns is punched into the shape of the base 31 having the turn portion CV2 by using a mold having a bent shape. Through the process, the base 31 having the turn portion CV2 is formed. The above-described punching process is not only the option, and the base 31 having the turn portion CV2 may also be formed by, for example, being cut out by a laser.

The width of the base 31 (the length in a direction orthogonal to the extending direction) is larger than the width of the signal conductor 22 (the length in a direction orthogonal to the extending direction). More specifically, the width of the base 31 is a length nearly equal to, and larger than, the total length of the width of the signal conductor 22 and the widths of two ground land conductors 24 extending along the signal conductor 22.

The insulating protection film 32 is provided on one main surface of the base 31. The insulating protection film 32 includes an opening AP321, plural openings AP322, and plural openings AP323. The one main surface of the base 31 is exposed through the opening AP321, the plural openings AP322, and the plural openings AP323.

In plan view, the opening AP321 preferably has a shape the same as or similar to the shape of the base 31, in other words, the shape of the signal conductor 22. That is, a turn portion is provided at a position in the middle in the extending direction of the opening AP321. The width of the opening AP321 is larger than the width of the signal conductor 22 and smaller than the space between the plural ground land conductors 24 that are positioned across the signal conductor 22 from one another.

Each of the plural openings AP322 preferably has a rectangular or substantially rectangular shape in plan view. The plural openings AP322 are provided around one end and the other end of the opening AP321. The plural openings AP322 have the same or substantially the same arrangement pattern as the arrangement pattern of the plural ground land conductors 23.

Each of the plural openings AP323 preferably has a rectangular or substantially rectangular shape in plan view. The plural openings AP323 are provided, at spaces, in the extending direction of the opening AP321. The plural openings AP323 are provided beside the opening AP321, on both sides in the width direction. The plural openings AP323 have the same or substantially the same arrangement pattern as the arrangement pattern of the plural ground land conductors 24.

Thus, the second substrate 30 can be thin (with a low height) by being formed by using the base 31 of a metal plate.

Configuration of Electronic Device 10

Each of the plural components 50 is mounted on corresponding ones of the plural component land conductors 25 by using a conductive bonding material such as, for example, solder. The component 50 corresponds to a "third component".

The second substrate 30 is provided on the first substrate 20 so that a surface, of the second substrate 30, on which the insulating protection film 32 opposes the main surface 211 of the first substrate 20. At this point, the second substrate 30 is provided on the first substrate 20 so that the opening AP321 opposes the signal conductor 22, the plural openings AP322 opposes the respective plural ground land conductors 23, and the plural openings AP323 oppose the respective plural ground land conductors 24. Note that the opening AP321 may be omitted. In this case, for example, a protection effect on the base 31 of a metal plate can be obtained.

By using a conductive bonding material 40 such as solder, for example, each of the plural ground land conductors 23 is electrically and physically bonded to a surface, of the base 31 of the second substrate 30, being exposed through a corresponding one of the plural openings AP322 (refer to FIG. 4B).

By using the conductive bonding material 40 such as, for example, solder, each of the plural ground land conductors 24 is electrically and physically bonded to a surface, of the base 31 of the second substrate 30, being exposed through a corresponding one of the plural openings AP323 (refer to FIG. 4A).

With such a configuration, the base 31 and the signal conductor 22 can oppose one another while being spaced away from one another at a predetermined distance, and the base 31 can be connected to the ground. That is, with the electronic device 10, a microstrip transmission line in which the signal conductor 22 defines and functions as a signal line, and the base 31 defines and functions as the ground (corresponding to a "first ground conductor") can be provided. Although not illustrated, the base 21 of the first substrate 20 may further include, thereinside, a ground conductor (corresponding to an "inner ground conductor"). In this case, with the electronic device, a triplate strip transmission line can be provided.

The second substrate 30 preferably has the same or substantially the same thickness as the base 31. Thus, the second substrate 30 has a low height, compared with a known structure in which various types of conductor patterns are arranged on the second substrate 30 in the thickness direction. Thus, the configuration in which the second substrate 30 is mounted on the first substrate 20 can have a low height, and the height of the electronic device 10 can be reduced.

In addition, as FIGS. 4A to 4C illustrate, a gap CA is provided between the signal conductor 22 and the base 31, at a location at which the signal conductor 22 and the base 31 oppose one another. Thus, under the same condition regarding the distance between the signal conductor 22 and the base 31, the capacitance between the signal conductor 22 and the base 31 can be reduced, compared with when an insulator (dielectric) is provided in the entire region between the signal conductor 22 and the base 31. In other words, the distance between the signal conductor 22 and the base 31 can be reduced when the capacitance between the signal conductor 22 and the base 31 is the same in both cases. That is, when the characteristic impedance of the microstrip transmission line is the same, with the configuration of the electronic device 10, the distance between the second substrate 30 and the first substrate 20 can be reduced. Thus, the height of the electronic device 10 can be further reduced.

In addition, dielectric loss can be reduced by the gap CA being provided, and, with the electronic device 10, the low-loss microstrip transmission line can be provided. The gap CA may be filled with resin if so desired. This structure can be provided with a resin structure (spacer) that fits the size of the gap CA and a resist film on the second substrate 30. Alternatively, this structure can be provided by, for example, after the electronic device 10 is mounted, fluid resin being injected into the gap CA and being solidified. Thus, the electronic device 10 is easily mounted. Another possible structure may include the gap CA that is not fully filled with resin while the gap is partially maintained (a structure in which the gap and the resin coexist).

In addition, the configuration preferably includes the plural openings of the insulating protection film 29 of the first substrate 20, and the plural openings AP322 and the plural openings AP323 of the insulating protection film 32 of the second substrate 30, and the amount of the conductive bonding material 40 can thus be adjusted by using the above-described openings. Thus, the distance between the signal conductor 22 and the base 31 can be adjusted in a stable manner. Accordingly, with the electronic device 10, the transmission line having a stable characteristic impedance can be provided.

In addition, in the above-described configuration, the gap CA is provided between the signal conductor 22 and the base 31, and the insulating protection film 29 is also provided therebetween. Thus, a short circuit between the signal conductor 22 and the base 31 can be prevented from being caused.

In addition, the height of the entire electronic device 10 can be reduced by the height of the component 50 being smaller than or equal to the thickness of the second substrate 30.

In the above-described configuration, in the first substrate 20, the insulating protection film 29 covers the signal conductor 22 and a surface height of the insulating protection film 29 does not change or substantially change. In the second substrate 30, the insulating protection film 32 preferably includes the opening AP321 in a portion thereof opposing the signal conductor 22.

Figure 7A:
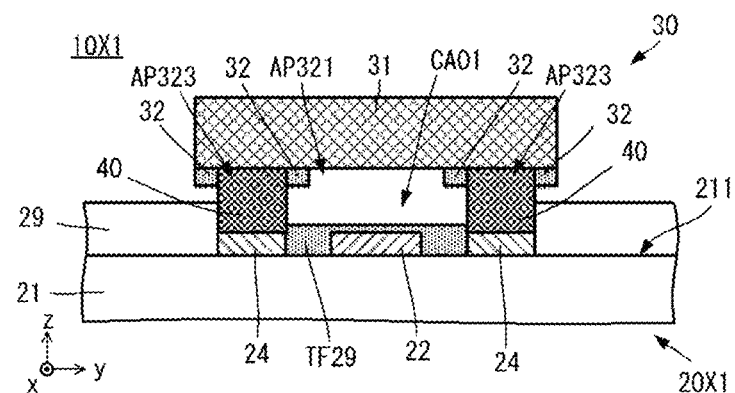
FIGS. 7A to 7C are sectional views of the configurations of respective similar types of the electronic device 10 according to the first preferred embodiment of the present invention.
Figure 7B:
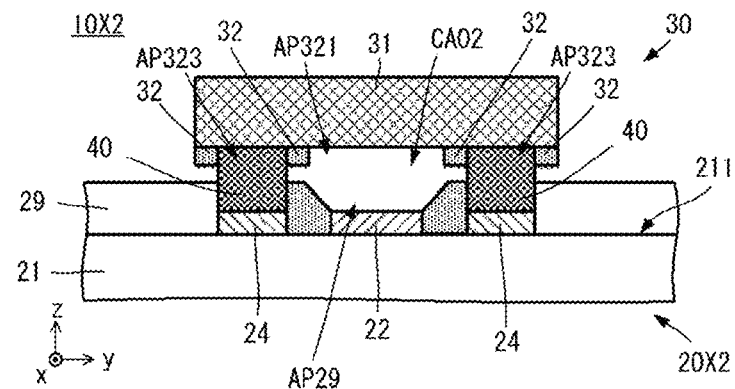
Figure 7C:
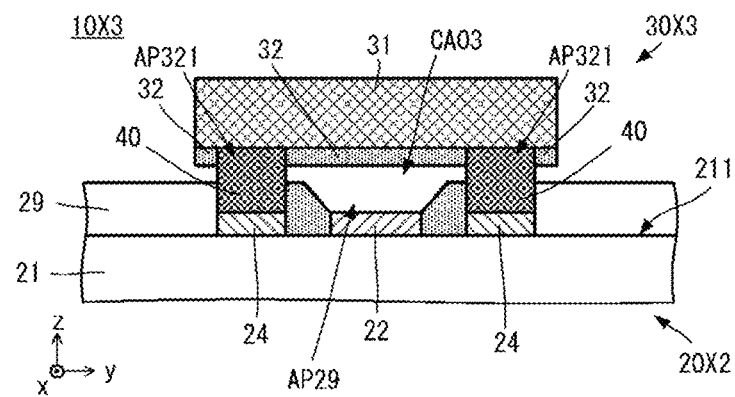

However, the configurations illustrated in FIGS. 7A to 7C may also be used. FIGS. 7A to 7C are sectional views of the configurations of the same or similar types of the electronic device 10 according to the first preferred embodiment. The basic configurations of the same or similar types of the electronic device 10 are the same as or similar to the configuration of the electronic device 10, and, hereinafter, only differences will be described.

As FIG. 7A illustrates, an electronic device 10X1 includes a first substrate 20X1. The insulating protection film 29 of the first substrate 20X1 includes a thin portion TF29 in a region in which the insulating protection film 29 overlaps the signal conductor 22. Specifically, for example, the thin portion TF29 is provided between two ground land conductors 24 holding the signal conductor 22 therebetween. The thin portion TF29 has a thickness larger than the thickness of the signal conductor 22 and smaller than the thickness of the other portion of the insulating protection film 29.

By the electronic device 10X1 having this configuration, the ratio of a gap CA01 to the entire region between the signal conductor 22 and the base 31 can be increased. Thus, the distance between the first substrate 20X1 and the second substrate 30 can further be reduced, the height of the electronic device 10X1 can further be reduced, and the loss of transmission line can be reduced.

As FIG. 7B illustrates, an electronic device 10X2 includes a first substrate 20X2. The insulating protection film 29 of the first substrate 20X2 includes an opening AP29 whose position overlaps the signal conductor 22. Thus, the signal conductor 22 is exposed to the second substrate 30 side.

By having this configuration, the electronic device 10X2 includes a gap CA02 provided entirely or substantially entirely in a region between the signal conductor 22 and the base 31. Thus, the distance between the first substrate 20X2 and the second substrate 30 can further be reduced, the height of the electronic device 10X2 can further be reduced, and the loss of transmission line can be reduced.

As FIG. 7C illustrates, an electronic device 10X3 includes the first substrate 20X2 and a second substrate 30X3. In the second substrate 30X3, the insulating protection film 32 is also provided in a region opposing the signal conductor 22.

By the electronic device 10X3 having this configuration, an unnecessary short circuit between the signal conductor 22 and the base 31 can be prevented from being caused.

In addition, in the above-described configuration, the signal conductor 22 may be covered with the base 21. For example, the signal conductor 22 may be provided, inside the base 21, near the main surface 211. In this case, a portion of the insulating protection film overlapping the signal conductor 22 may be omitted.

In addition, the signal conductor 22 and the base 31 both may be covered with the insulating protection films in a region in which the signal conductor 22 and the base 31 overlap one another. In this case, a short circuit between the signal conductor 22 and the base 31 can be prevented from being caused, and conductors and metal surfaces can be protected.

Second Preferred Embodiment

Figure 8:
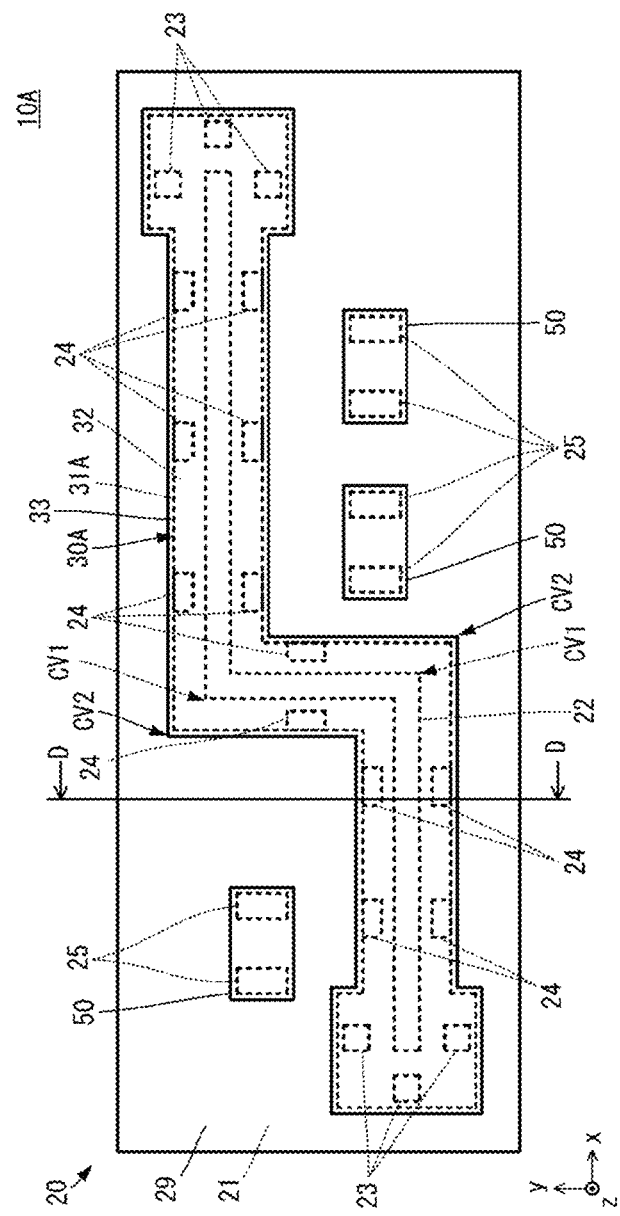
FIG. 8 is a plan view of an electronic device 10A according to a second preferred embodiment of the present invention.
Figure 9:
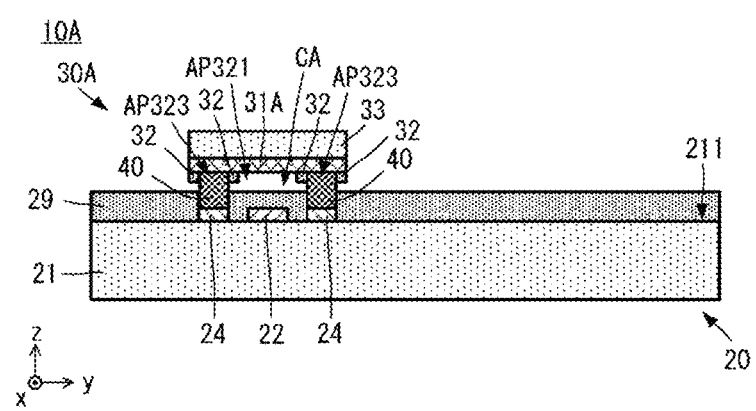
FIG. 9 is a sectional view of the electronic device 10A according to the second preferred embodiment of the present invention.

An electronic device according to a second preferred embodiment of the present invention will be described with reference to the drawings. FIG. 8 is a plan view of the electronic device according to the second preferred embodiment. FIG. 9 is a sectional view of an electronic device 10A according to the second preferred embodiment. In the drawings, for example, dimensions are exaggerated appropriately for facilitating understanding of the characteristics of the present disclosure.

As FIG. 8 and FIG. 9 illustrate, the electronic device 10A according to the second preferred embodiment differs from the electronic device 10 according to the first preferred embodiment, regarding the configuration of a second substrate 30A. The configuration of the electronic device 10A other than the second substrate 30A is preferably the same as or similar to that of the electronic device 10, and the description of the same or similar parts will be omitted.

In plan view, the second substrate 30A preferably has a shape the same or substantially the same as the shape of the second substrate 30. The second substrate 30A includes a conductive base 31A, and the insulating protection film 32, and an insulating base 33.

The insulating base 33 is preferably made of, for example, a material mainly including a liquid crystal polymer and having flexibility. The insulating base 33 is not limited to an insulating base having flexibility.

The conductive base 31A is preferably made of, for example, a material such as copper foil the same as or similar to the material of the signal conductor 22. The conductive base 31A is preferably as thin as possible within a desired range of a conductor loss. The conductive base 31A is provided entirely or substantially entirely on one main surface of the insulating base 33.

The insulating protection film 32 covers the conductive base 31A. The insulating protection film 32 includes the opening AP321, the plural openings AP322, and the plural openings AP323. The conductive base 31A is partially exposed through the openings.

The conductive base 31A is connected to the plural ground land conductors 24 of the first substrate 20 by the conductive bonding material 40 provided inside each of the plural openings AP322 and the plural openings AP323.

Due to such a configuration, the electronic device 10A exhibits advantageous effects the same as or similar to the advantageous effects of the electronic device 10.

In addition, in this configuration, the insulating base 33 covers a surface of the conductive base 31A on the side opposite to the signal conductor 22 side. Thus, a short circuit between the conductive base 31A and an electric circuit outside the electronic device 10A can be prevented from being caused. That is, a short circuit between the ground of the transmission line including the electronic device 10A and an electric circuit outside the electronic device 10A can be prevented from being caused.

Although the details are not illustrated, the configuration of the signal conductor 22 and/or the configuration of the base 31 that are described in the above first preferred embodiment may also be applied to the second preferred embodiment in the case in which the signal conductor 22 and/or the conductive base 31A is covered with the insulating protection film and/or is embedded inside the base.

Third Preferred Embodiment

Figure 10:
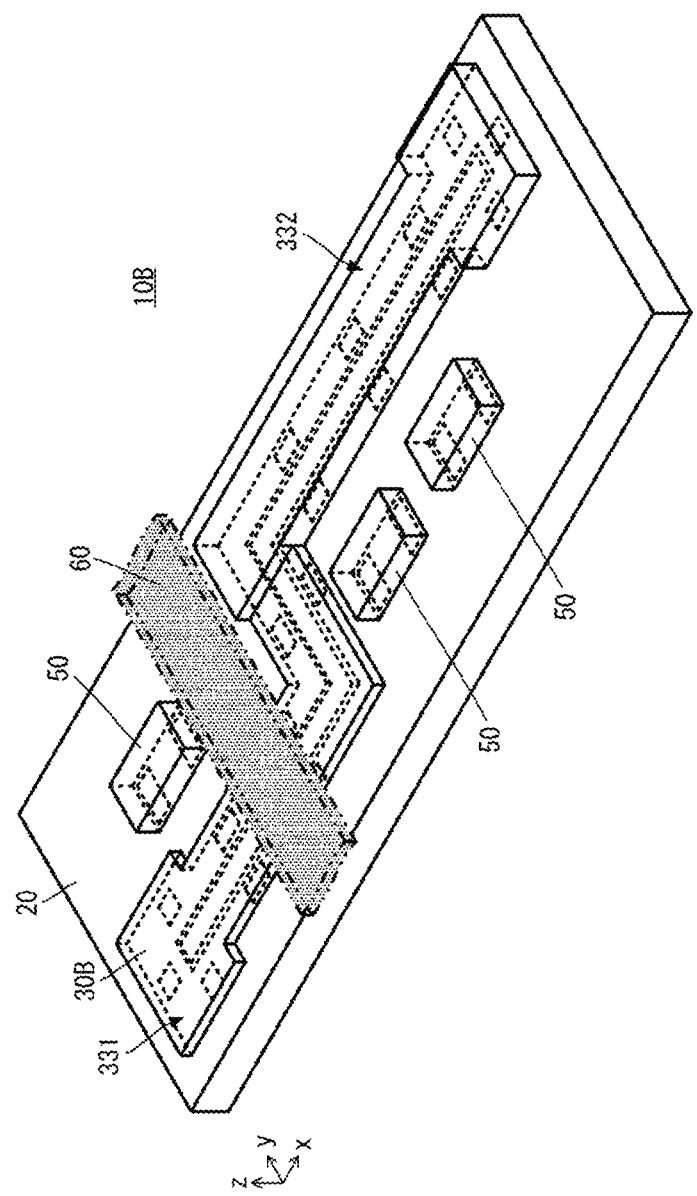
FIG. 10 is a perspective view of an electronic device 10B according to a third preferred embodiment of the present invention.
Figure 11:
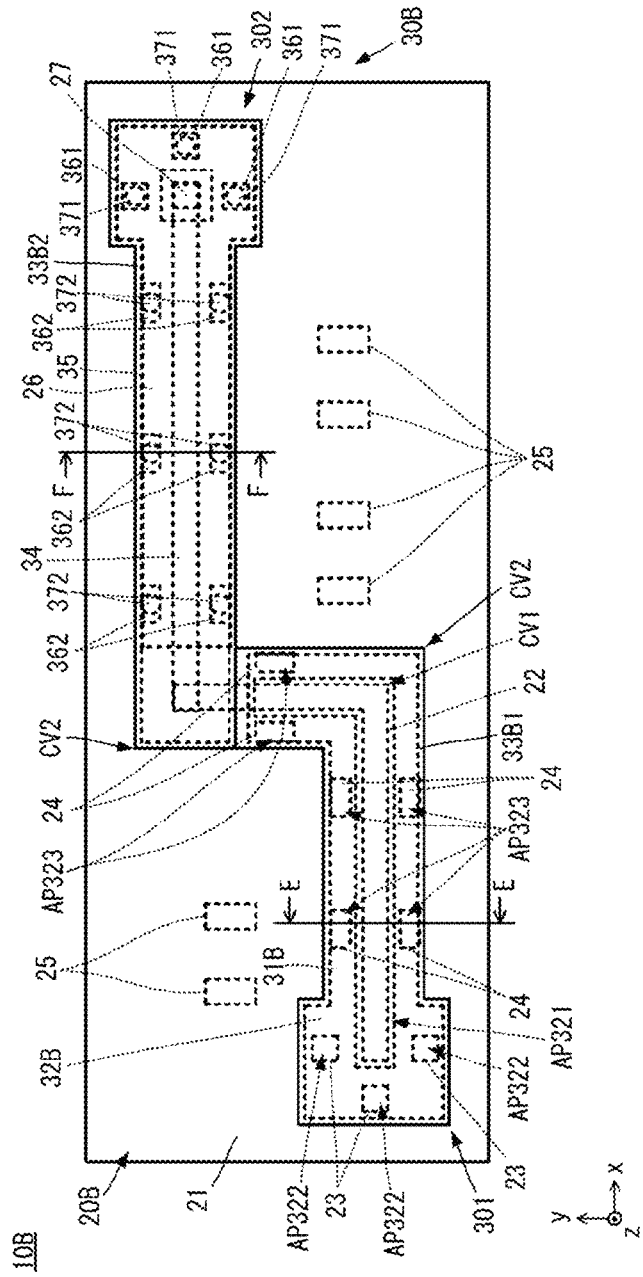
FIG. 11 is a plan view of the electronic device 10B according to the third preferred embodiment of the present invention.
Figure 12A:
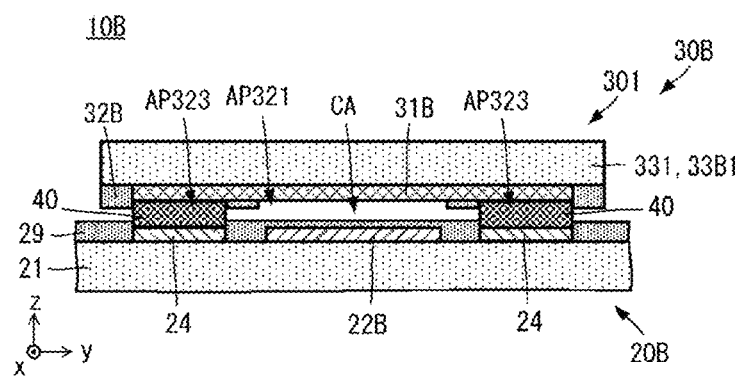
FIGS. 12A and 12B are sectional views of the electronic device 10B according to the third preferred embodiment of the present invention.
Figure 12B:
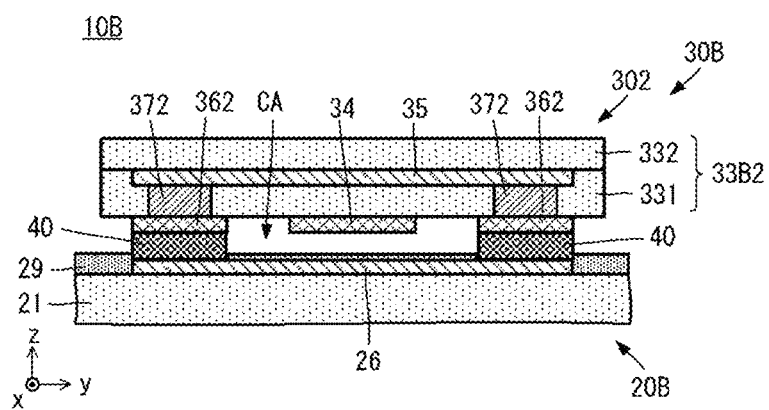
Figure 13:
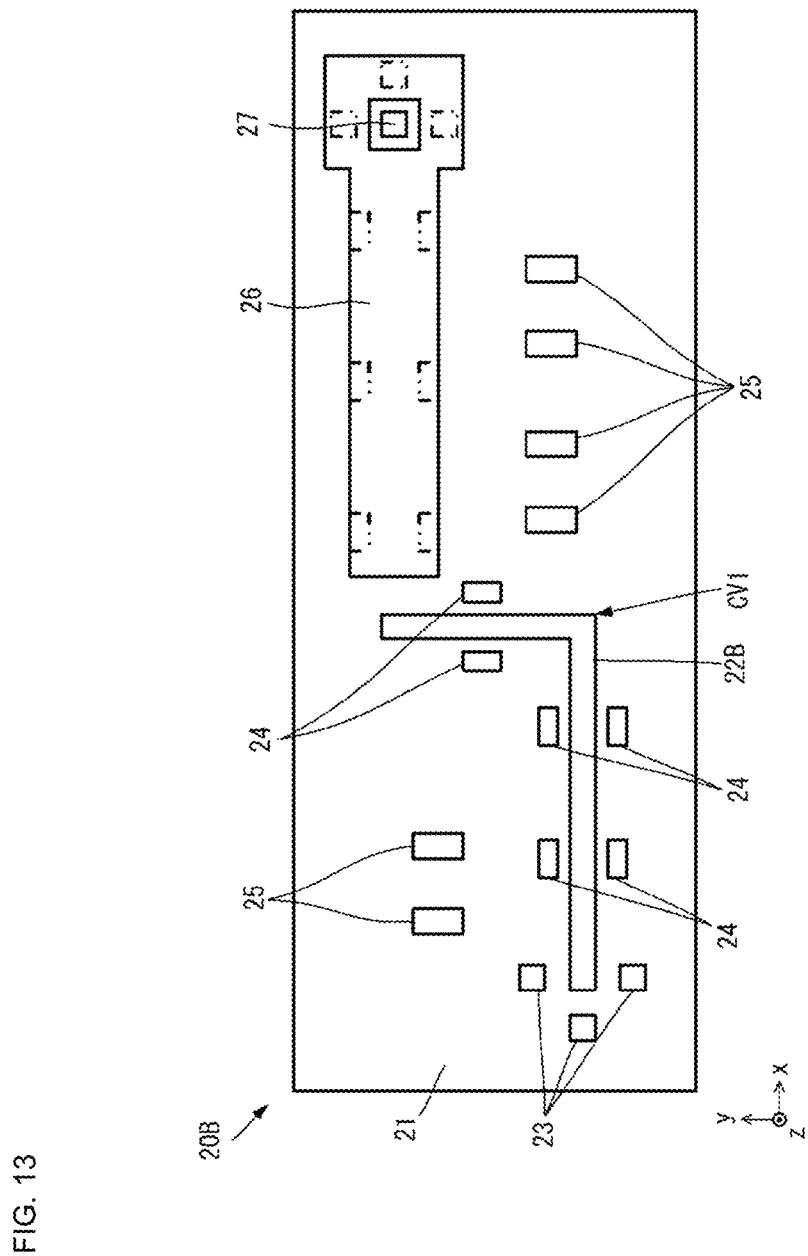
FIG. 13 is a plan view of a first substrate of the electronic device 10B according to the third preferred embodiment of the present invention.
Figure 15A:
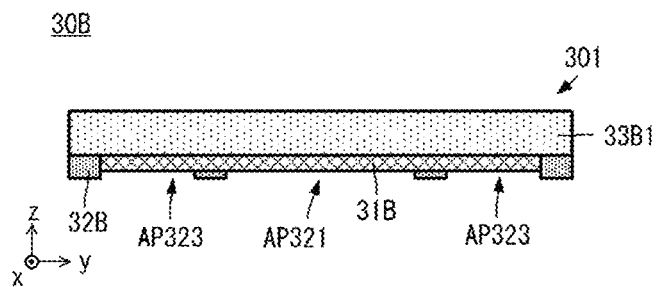
FIGS. 15A and 15B are sectional views of the second substrate 30B of the electronic device 10B according to the third preferred embodiment of the present invention.
Figure 15B:
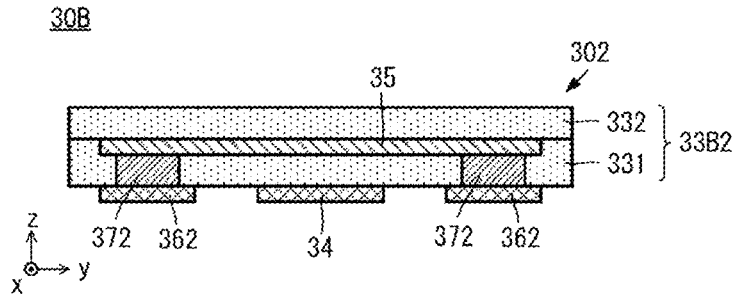

An electronic device according to a third preferred embodiment of the present invention will be described with reference to the drawings. FIG. 10 is a perspective view of an electronic device 10B according to the third preferred embodiment. FIG. 11 is a plan view of the electronic device 10B according to the third preferred embodiment. FIGS. 12A and 12B are sectional views of the electronic device 10B according to the third preferred embodiment. FIG. 13 is a plan view of a first substrate 20B of the electronic device 10B according to the third preferred embodiment. FIGS. 14A and 14B include plan views of a second substrate 30B of the electronic device 10B according to the third preferred embodiment. FIGS. 15A and 15B are sectional views of the second substrate 30B of the electronic device 10B according to the third preferred embodiment.

As FIG. 10, FIG. 11, FIGS. 12A, 12B, FIG. 13, FIGS. 14A and 14B, and FIGS. 15A and 15B illustrate, the electronic device 10B according to the third preferred embodiment preferably differs from the electronic device 10A according to the second preferred embodiment in that the electronic device 10B further includes a transmission line portion. The configuration of the electronic device 10B other than the transmission line portion is the same as or similar to that of the electronic device 10A, and the description of the same or similar parts will be omitted.

The electronic device 10B includes the first substrate 20B and the second substrate 30B.
Configuration of First Substrate The first substrate 20B differs from the first substrate 20 in that the first substrate 20B includes a signal conductor 22B and a ground conductor 26. The signal conductor 22B includes the turn portion CV1 in the middle in the extending direction of the signal conductor 22B and has a portion extending in the x-axis direction and a portion extending in the y-axis direction.

The ground conductor 26 is provided on the side opposite to the portion, of the signal conductor 22B, extending in the x-axis direction, relative to the portion, of the signal conductor 22B, extending in the y-axis direction. The ground conductor 26 has a shape extending in the x-axis direction. On end of the ground conductor 26 in the extending direction of the ground conductor 26 is near an end portion of the portion, of the signal conductor 22B, extending in the y-axis direction. The ground conductor 26 has a width larger than the width of the signal conductor 22B.

The second substrate 30B preferably includes a first portion 301 and a second portion 302. The first portion 301 includes the turn portion CV2 and a portion extending in the x-axis direction and a portion extending in the y-axis direction. The basic configuration of the first portion 301 of the second substrate 30B is preferably the same as or similar to the configuration of the second substrate 30A according to the second preferred embodiment.
Configuration of Second Substrate As FIG. 15A illustrates, the first portion 301 of the second substrate 30B includes an insulating base 33B1, a conductive base 31B, and an insulating protection film 32B. The conductive base 31B is provided on one main surface of the insulating base 33B1. The insulating protection film 32B covers the conductive base 31B. The insulating protection film 32B includes the opening AP321, the plural openings AP322, and the plural openings AP323. The first portion 301 of the second substrate 30B includes the above-described turn portion CV2 and includes the portion extending in the x-axis direction and the portion extending in the y-axis direction.

As FIG. 15B illustrates, the second portion 302 of the second substrate 30B includes an insulating base 33B2, a linear conductor 34, a planar conductor 35, plural connection conductors 362, and plural interlayer connection conductors 372. The insulating base 33B2 is a multilayer body of an insulator layer 331 and an insulator layer 332. The insulator layer 331 and the insulating base 33B1 of the first portion 301 are preferably provided as one single body.

The linear conductor 34 is provided on a surface of the insulator layer 331 on the side opposite to a surface being in contact with the insulator layer 332, that is, on one main surface of the insulating base 33B2. The linear conductor 34 has a shape extending in the extending direction of the second portion 302.

The planar conductor 35 is provided on the interface between the insulator layer 331 and the insulator layer 332. The planar conductor 35 is provided on the substantially entire interface of the insulating base 33B2.

The plural connection conductors 362 are provided on the one main surface of the insulating base 33B2 in the same or similar manner as the linear conductor 34 is provided. The plural connection conductors 362 are arranged, along the linear conductor 34, in the extending direction of the linear conductor 34.

The plural interlayer connection conductors 372 pass through the insulator layer 331 and connect the respective plural connection conductors 362 to the planar conductor 35.

Thus, the second substrate 30B is defined by the low-height first portion 301 corresponding to one insulator layer and including one layer of conductor; and the second portion 302 corresponding to two insulator layers, including two layers of conductor, and enabling a more complex circuit pattern.
Configuration of Electronic Device 10B
First Portion 301—Including Region of Second Substrate 30B

As FIG. 10, FIG. 11, and FIG. 12A illustrate, the first portion 301 of the second substrate 30B is provided on the first substrate 20B so that a surface, of the first portion 301, including the insulating protection film 32B thereon opposes one main surface of the first substrate 20B, more specifically, one main surface of a portion, of the first substrate 20B, including the signal conductor 22B. At this point, the first portion 301 of the second substrate 30B is provided on the first substrate 20B so that the opening AP321 opposes the signal conductor 22B, the plural openings AP322 oppose the respective plural ground land conductors 23, and the plural openings AP323 oppose the respective plural ground land conductors 24.

By using the conductive bonding material 40 such as solder, for example, each of the plural ground land conductors 23 is electrically and physically bonded to a surface, of the conductive base 31B of the second substrate 30B, being exposed through a corresponding one of the plural openings AP322.

By using the conductive bonding material 40 such as solder, for example, each of the plural ground land conductors 24 is electrically and physically bonded to a surface, of the conductive base 31B of the second substrate 30B, being exposed through a corresponding one of the plural openings AP323 (refer to FIG. 12A).

With such a configuration, the conductive base 31B and the signal conductor 22 can oppose one another while being spaced away from one another at a predetermined distance, and the conductive base 31B can be connected to the ground. That is, with the electronic device 10B, at the first portion 301 of the second substrate 30B, a microstrip transmission line in which the signal conductor 22B defines and functions as a signal line, and the conductive base 31B defines and functions as the ground can be provided. Thus, at the first portion 301 of the second substrate 30B, the low-height transmission line can be provided.

Second Portion 302—Including Region of Second Substrate 30B

As FIG. 10, FIG. 11, and FIG. 12B illustrate, the second portion 302 of the second substrate 30B is provided on the first substrate 20B so that a surface, of the second portion 302, having the connection conductors 362 thereon opposes one main surface of the first substrate 20B, more specifically, one main surface of a portion, of the first substrate 20B, including the ground conductor 26. At this point, the second portion 302 of the second substrate 30B is provided on the first substrate 20B so that the linear conductor 34 and the plural connection conductors 362 oppose the ground conductor 26.

The ground conductor 26 of the first substrate 20B is electrically and physically bonded to each of the plural connection conductors 362 of the second substrate 30B by using the conductive bonding material 40 such as solder, for example.

With such a configuration, the linear conductor 34 is provided between the ground conductor 26 and the planar conductor 35 while being spaced away from each of the ground conductor 26 and the planar conductor 35 at a predetermined distance. The planar conductor 35 is electrically connected to the ground conductor 26 with the plural interlayer connection conductor 372 and the plural connection conductors 362 interposed between the planar conductor 35 and the ground conductor 26.

Thus, a triplate strip transmission line can be provided, in the electronic device 10B, in a region corresponding to the second portion 302 of the second substrate 30B. In the triplate strip transmission line, a signal line provided by using the linear conductor 34 (corresponding to a "second signal conductor") is held between the grounds provided by using the ground conductor 26 and the planar conductor 35 (that corresponds to a "second ground conductor"). Thus, apart from the above-described low-height portion, a transmission line can be provided, in the electronic device 10B, in the region corresponding to the second portion 302 of the second substrate 30B.

With such a configuration, the electronic device 10B can include more various transmission lines while including the portion producing the above-described advantageous effects. This configuration includes the gap CA, in the triplate strip transmission line, between the linear conductor 34 and the ground conductor 26. Thus, compared with a configuration without a gap CA, the height of the triplate strip transmission line is reduced, and dielectric loss can also be reduced.

In addition, in this configuration, the linear conductor 34 defining and functioning as a signal conductor is provided closer to the first substrate 20B than the planar conductor 35 defining and functioning as a ground conductor. Thus, unwanted waves radiated from the linear conductor 34 are blocked by the planar conductor 35. The planar conductor 35 further blocks external unwanted waves, and the waves hardly propagate to the linear conductor 34.

In addition, with this configuration, the height of the second substrate 30B is reduced at the portion corresponding to the first portion 301. Thus, as FIG. 10 illustrates, an electronic element 60 of substrate type provided with, for example, another transmission line can be provided while passing over the second substrate 30B. In other words, with the electronic device 10B, while the height of the transmission line over which another electronic element 60 passes is reduced, a transmission line in another region can be provided in a desired mode. Thus, even when another substrate-type electronic element 60 overlaps the electronic device 10B, the height of such a complex can be reduced.

Although the configuration with a triplate strip transmission line is described in the present preferred embodiment, a transmission line in a different mode such as, for example, a coplanar transmission line may also be used.

Although the details are not illustrated, the configuration of the signal conductor 22 and/or the configuration of the base 31 that are described in the above first preferred embodiment may also be applied to the second preferred embodiment in the case in which the signal conductor 22 and/or the conductive base 31A is covered with the insulating protection film and/or is embedded inside the base.

In addition, although the details are not illustrated, the configuration of the signal conductor 22 and/or the configuration of the base 31 that are described in the above first preferred embodiment may also be applied to the third preferred embodiment in the case in which, for example, various conductors including the linear conductor 34 and/or various conductive bases including the conductive base 31B are covered with the insulating protection film and/or are embedded inside the base.

Figure 16:
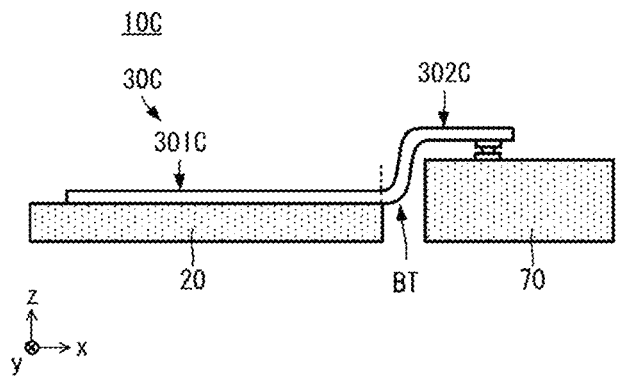
FIG. 16 is a side view of a derivative form of the electronic device 10B according to the third preferred embodiment of the present invention.

In addition, with the above-described configuration of the transmission line, installation illustrated in FIG. 16, for example, may be possible. FIG. 16 is a side view of a derivative form of the electronic device according to the third preferred embodiment.

As FIG. 16 illustrates, an electronic device 10C includes the first substrate 20, a second substrate 30C, and a third substrate 70. The first substrate 20 preferably has a configuration the same as or similar to the portion, of the above-described first substrate 20B, opposing the first portion 301 of the second substrate 30B. The second substrate 30C includes a first portion 301C and a second portion 302C. The first portion 301C preferably has a configuration the same as or similar to the configuration of the above-described first portion 301, and the second portion 302C preferably has a configuration the same as or similar to the configuration of the above-described second portion 302.

The first portion 301C of the second substrate 30C is bonded to the first substrate 20. A connector is mounted on the second portion 302C of the second substrate 30C. The connector is connected to a transmission line at the second portion 302C. The second portion 302C of the second substrate 30C is connected to the third substrate 70 by using the connector.

Here, in the z-axis direction, the position (height) of a surface, of the first substrate 20, to which the first portion 301C of the second substrate 30C is bonded differs from the position (height) of a surface, of the third substrate 70, to which the second portion 302C of the second substrate 30C is connected.

Thus, the second substrate 30C includes a bent portion BT. As FIG. 16 illustrates, at the bent portion BT, in side view, the thickness direction of the second substrate 30C is changed. The second portion 302C of the second substrate 30C includes the bent portion BT.

As described above, the second portion 302C can be provided with a transmission line in a desired mode. Thus, the second portion 302C is provided with, for example, a transmission line including an insulating base having flexibility, thus easily having the bent portion BT. At this point, the shape of the bent portion BT can be easily maintained by a plastic deformable material being used.

In the above description, the transmission line in which the first substrate includes one signal conductor is provided. However, for example, the above-described configuration can also be applied to a transmission line, such as a differential line, in which plural signal conductors extending parallelly to one another are provided on the first substrate. When such plural signal conductors are used, ground conductors defined by using second substrates may be provided so as to oppose the respective plural signal conductors, or one ground conductor opposing all of the plural signal conductors may be provided.

In the horizontal direction (direction parallel or substantially parallel to the xy plane) or in the layering direction (z-axis direction), the shape of the second substrate may be bent or the shapes of both the first substrate and the second substrate may be bent.

In addition, in each of the above-described preferred embodiments, the size of the first substrate and the size of the second substrate differ from one another on the xy plane. However, in the first preferred embodiment and the second preferred embodiment, the external size of the first substrate and the external size of the second substrate may be the same or substantially the same on the xy plane. On the other hand, in the third preferred embodiment, the first substrate is preferably larger than the second substrate on the xy plane because the substrate-type electronic element 60 is provided while passing over the second substrate 30B.

In addition, the configurations of the above-described preferred embodiments may be combined appropriately, and advantageous effects according to each of the combinations can be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
   a first substrate on or in which a first signal conductor extending in a transmission direction of a high-frequency signal is provided; and
   a second substrate on or in which a first ground conductor is provided; wherein
   a gap is provided between the first signal conductor and the first ground conductor;
   the gap is defined by an open space;
   the first signal conductor includes a turn portion in plan view; and
   the first ground conductor overlaps the first signal conductor in plan view and includes a turn portion while extending along the first signal conductor.

2. The electronic device according to claim 1, further comprising:
   a third component mounted on the first substrate; wherein
   the second substrate has a shape bent in plan view so to not overlap the third component.

3. The electronic device according to claim 1, wherein the first ground conductor is thicker than the first signal conductor and is made of metal.

4. The electronic device according to claim 1, wherein the second substrate includes the first ground conductor as a main portion.

5. The electronic device according to claim 1, wherein the second substrate includes a protection film having an electrically insulating property and defining a mounting portion that is mounted on the first substrate.

6. The electronic device according to claim 5, wherein the protection film includes an opening in a portion opposing the first signal conductor.

7. The electronic device according to claim 6, wherein a portion of the first ground conductor is exposed through the opening.

8. The electronic device according to claim 1, wherein the first substrate includes a protection film having an electrically insulating property and defining a land portion on which the second substrate is mounted.

9. The electronic device according to claim 8, wherein the protection film includes an opening through which the first signal conductor is exposed.

10. The electronic device according to claim 1, wherein the first substrate includes an inner ground conductor opposing the first signal conductor, on a side opposite to a side of the second substrate with reference to the first signal conductor.

11. The electronic device according to claim 1, wherein the second substrate further includes:
    a second ground conductor connected to the first ground conductor; and
    a transmission line portion including a second signal conductor connected to the first signal conductor.

12. The electronic device according to claim 11, wherein the second signal conductor is closer to the first substrate than the second ground conductor is.

13. The electronic device according to claim 11, wherein the second substrate includes a thin portion in a region other than a region of the transmission line portion; and
    an electronic element having a substrate shape and passing over the thin portion is provided.

14. The electronic device according to claim 1, wherein, in a side view, the second substrate includes a bent portion at which a thickness direction of the second substrate is changed.

15. The electronic device according to claim 1, wherein the second substrate is connected to the first substrate and a third substrate at different positions in an extending direction of the second substrate.

16. The electronic device according to claim 15, wherein the second substrate is connected to the first substrate or the third substrate, with a connector interposed therebetween.

17. The electronic device according to claim 1, wherein the turn portion of the first signal conductor is located at a middle of the first signal conductor in the extending direction.

18. The electronic device according to claim 1, wherein the first ground conductor has a rectangular or substantially rectangular shape in plan view.

19. The electronic device according to claim 1, wherein the second substrate includes a substrate turn portion.

20. The electronic device according to claim 1, wherein at least one protection film is provided on at least one of the first and second substrates to define the gap.

\* \* \* \* \*